United States Patent
Lee et al.

(10) Patent No.: US 9,815,149 B2
(45) Date of Patent: Nov. 14, 2017

(54) FLUX COMPOSITION AND TECHNIQUES FOR USE THEREOF

(75) Inventors: Kang-Wook Lee, Yorktown Heights, NY (US); Nathalie Normand, Bromont (CA); Valerie Oberson, St-Alphonse de Granby (CA)

(73) Assignee: International Business Machines Corporation, Armonk, NY (US)

( * ) Notice: Subject to any disclaimer, the term of this patent is extended or adjusted under 35 U.S.C. 154(b) by 954 days.

(21) Appl. No.: 13/438,213

(22) Filed: Apr. 3, 2012

(65) Prior Publication Data
US 2012/0217290 A1 Aug. 30, 2012

Related U.S. Application Data

(63) Continuation-in-part of application No. 13/034,932, filed on Feb. 25, 2011.

(51) Int. Cl.
| | | |
|---|---|---|
| B23K 35/362 | (2006.01) | |
| B23K 35/36 | (2006.01) | |
| B23K 1/00 | (2006.01) | |
| B23K 35/26 | (2006.01) | |

(52) U.S. Cl.
CPC .......... *B23K 35/362* (2013.01); *B23K 1/0016* (2013.01); *B23K 35/262* (2013.01); *B23K 35/3601* (2013.01); *B23K 35/3612* (2013.01); *B23K 35/3618* (2013.01)

(58) Field of Classification Search
CPC .............. B23K 35/3618; B23K 35/362; B23K 35/3601; H05K 3/3489; C07C 45/36; A61K 2300/00
USPC ............................................................ 148/23
See application file for complete search history.

(56) References Cited

U.S. PATENT DOCUMENTS

| | | | |
|---|---|---|---|
| 4,168,996 A | 9/1979 | Zado | |
| 4,441,938 A * | 4/1984 | Poliak | B23K 35/3613 148/23 |
| 4,478,650 A * | 10/1984 | Zado | 148/23 |
| 4,762,573 A | 8/1988 | Biverstedt | |
| 5,091,242 A | 2/1992 | Chung | |
| 5,177,134 A | 1/1993 | Mullen, III et al. | |

(Continued)

FOREIGN PATENT DOCUMENTS

| | | | |
|---|---|---|---|
| DE | 4415527 A1 * | 11/1995 | ......... B23K 35/3618 |
| DE | 4416627 A1 | 11/1995 | |
| WO | 9821264 A1 | 5/1998 | |

OTHER PUBLICATIONS

Cookson Electronics Alpha. http://alpha.cooksonelectronics.com/main.asp, pp. 1-2, downloaded May 17, 2011.

(Continued)

*Primary Examiner* — Weiping Zhu
(74) *Attorney, Agent, or Firm* — Ryan, Mason & Lewis, LLP

(57) ABSTRACT

The present invention is directed to flux compositions and uses thereof. One composition comprises an activator and a solvent being a glycerol ethoxylate with a molecular weight of 200-500. Another composition comprises an activator, a solvent being a glycerol ethoxylate with a molecular weight of 200-500 and an amine. A soldering method for joining objects is also provided, comprising the steps of applying a flux composition to at least a portion of one or more of the objects, and joining the objects.

5 Claims, 4 Drawing Sheets

(56) References Cited

U.S. PATENT DOCUMENTS

| | | |
|---|---|---|
| 5,297,721 A | 3/1994 | Schneider et al. |
| 5,411,602 A | 5/1995 | Hayes |
| 5,615,827 A | 4/1997 | Arldt et al. |
| 5,830,389 A | 11/1998 | Capote et al. |
| 6,524,398 B2 | 2/2003 | Arora et al. |
| 6,550,667 B2 | 4/2003 | Bernier et al. |
| 6,585,963 B1 * | 7/2003 | Quan et al. ............... 424/61 |
| 7,017,795 B2 | 3/2006 | Liu et al. |
| 7,022,266 B1 | 4/2006 | Craig |
| 7,241,348 B2 | 7/2007 | Wada et al. |
| 7,271,100 B2 | 9/2007 | Lee et al. |
| 7,575,150 B2 | 8/2009 | Saito et al. |
| 7,740,713 B2 | 6/2010 | Duchesne et al. |
| 7,780,801 B2 | 8/2010 | Duchesne et al. |
| 2003/0125505 A1 | 7/2003 | Weaver et al. |
| 2004/0042993 A1 * | 3/2004 | Gabin ............... A61K 8/66 424/70.14 |
| 2004/0084510 A1 * | 5/2004 | Wetz et al. .................. 228/207 |
| 2004/0129344 A1 | 7/2004 | Arita et al. |
| 2005/0165203 A1 | 7/2005 | Kohn et al. |
| 2006/0147683 A1 * | 7/2006 | Ikeda et al. .................. 428/209 |
| 2007/0042010 A1 * | 2/2007 | Southall ............... A61K 8/41 424/401 |
| 2007/0122436 A1 | 5/2007 | Koltzenburg et al. |
| 2008/0124568 A1 * | 5/2008 | Duchesne ............ B23K 35/362 428/615 |
| 2010/0139952 A1 | 6/2010 | Arora et al. |

OTHER PUBLICATIONS

Ning-Cheng Lee, Fluxing for Flip Chip, http://www.flipchips.com/tutotial18.html, Apr. 2002, pp. 1-3, downloaded May 11, 2011.

Injection Molded Soldering, http://www.research.ibm.com/ims/, pp. 1-3.

George A. Riley, Introduction to Flip Chip: What, Why, How, http://www.flipchips.com/tutorial01.html, Oct. 2000, pp. 1-5.

Solder Bump Flip Chip, http://www.flipchips.com/tutorial02a.html, Nov. 2000, pp. 1-5.

Ken Gilleo, A Brief History of Flipped Chips, http://www.flipchips.com/tutorial06.html, Mar. 2001, pp. 1-9.

Deborah S. Patterson, The Back-End Process: Step 7—Solder Bumping Step by Step, http://www.electroiq.com/index/display/Packaging_Article_Tools_Template/_printArticle/articles/advanced-packaging/volume-10/issue-7/features/step-by-step/the-back-end-process-step-7-solder-bumping-step-by-step.html, pp. 1-9, downloaded May 18, 2011.

Gerard Minogue, Packaging, Handling, and Storage of Solder Spheres, http://www.flipchips.com/tutorial16.html, Feb. 2002, pp. 1-4.

Manufacturing conditions allowing "drop-in" lead free solder, http://www.flipchips.com/tutorial48.html, Jan. 2005, pp. 1-2.

George Riley, The Promise of C4NP, http://www.flipchips.com/tutorial55.html, Sep. 2005, pp. 1-3.

\* cited by examiner

FLUX COMPOSITION AND TECHNIQUES FOR USE THEREOF

CROSS REFERENCE TO RELATED APPLICATIONS

This is a continuation-in-part of U.S. patent application Ser. No. 13/034,932, filed Feb. 25, 2011, the disclosure of which is expressly incorporated by reference herein in its entirety for all purposes.

FIELD OF THE INVENTION

Embodiments of the invention generally relate to soldering techniques and, more particularly, to flux compositions and techniques for use thereof.

BACKGROUND OF THE INVENTION

Fluxes play an important role in solder-joining electronic components, such as semiconductor devices, onto printed circuit cards or printed circuit boards (PCBs). Flux is used in a process of flip-chip joining to a substrate that has ball grid arrays (BGA) or land grid arrays (LGA). In a typical process, by way of example, flux is applied onto a substrate followed by placing a chip onto the flux-applied substrate. Then, the chip-substrate module goes through a reflow process at a high temperature so as to make solder connections. The subsequently formed flux residue is cleaned (for example, with water) followed by drying the module. An underfill material is introduced into the gap between the chip and the substrate to maintain the integrity of the flip-chip package.

As the density of Controlled Collapse Chip Connection (C4) arrays and the chip size increase, the joining process sometimes produces non-wets at a corner of the large chip due to the smaller C4 size and the larger warpage of a substrate. It also becomes more difficult to clean flux residue, formed during flip-chip joining, out of the narrow chip-substrate gap of the large chip package.

Non-wets which make electrical open should be avoided, and flux residue often causes delamination between underfill and chip or between underfill and substrate, resulting in failure of flip-chip packages. As the size of solder balls in a chip decreases, slight movement of an aligned chip-laminate module during a reflow process can cause non-wets, because a typical high-throughput reflow tool tends to vibrate. Such non-wets can increase in the case of multi-chip modules.

However, after joining, left-over flux and by-products of the reaction between flux and solders need to be cleaned, preferably with a low cost and environment friendly method because cleaning with organic solvent is not only harmful to human beings and the environment but also expensive, in regards to both the material itself and the waste treatment process. Therefore, it would be desirable to develop a flux that has sufficient tackiness while the flux residue can be cleaned with water. Another type of flux residue includes organic polymers produced from flux molecules during the high temperature reflow in a modern forced convection reflow furnace with strong N2 gas flow as such a furnace is needed for manufacturing advanced semiconductor packages. The organic polymers cannot be dissolved in water if their molecular weight is high. Thus, there is a need that exists in such approaches to use a certain component of flux with low molecular weight so as not to form insoluble polymers even in the modern forced convection furnace with strong N2 gas flow.

Many existing fluxes in the industry, however, provide an inadequate joining capability in case of lead-free solders, give non-wets at the corner of a chip, leave considerable flux residue including organic polymers onto chip, C4 and substrate surfaces after cleaning, diffuse into the substrate outer layer, and/or cause chip movement during reflow.

By way of example, existing fluxes include disadvantageous aspects such as not providing perfect solder joining, resulting in a failure of the semiconductor package, not providing enough tackiness or viscosity, as well as often leaving polymer, tin oxide and/or organotin residues after reflow that cannot be cleaned with water.

Accordingly, there is a need for soldering flux compositions that can effectively manufacture the modern and high-performance semiconductor packages used for computers, communication devices, home electronics, game consoles, audio/video equipments, automobiles, etc.

SUMMARY OF THE INVENTION

Principles and embodiments of the invention provide a flux composition and techniques for use thereof. In one aspect of the invention, a flux composition is provided. The flux composition comprises an activator and a solvent being a glycerol ethoxylate with a molecular weight of 200-500.

In another aspect of the invention, a flux composition is provided. The flux composition comprises an activator, a solvent being a glycerol ethoxylate with a molecular weight of 200-500 and an amine.

In yet another aspect of the invention, a soldering method for joining objects is provided comprising the steps of applying a flux composition to at least a portion of one or more of the objects, and joining the objects.

These and other objects, features and advantages of the present invention will become apparent from the following detailed description of illustrative embodiments thereof, which is to be read in connection with the accompanying drawings.

DETAILED DESCRIPTION OF EMBODIMENTS

Figure 1:
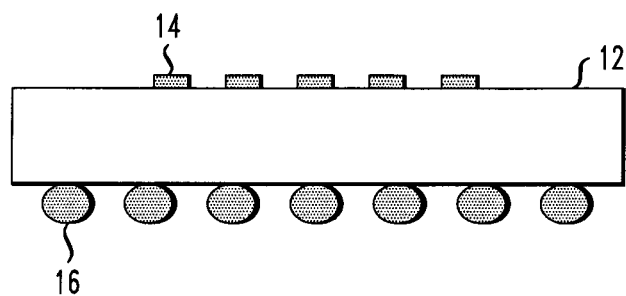
FIG. 1 is a diagram illustrating a substrate, according to an embodiment of the present invention.

A flux composition suitable for use in solder-joining, for example, electrical components, is disclosed herein. One or more embodiments of the invention include a water-soluble tacky flux composition. As detailed herein, a flux of one or more embodiments of the invention can include properties such as solder joining capability, tackiness, and water cleaning capability. Tackiness is related to and indicated by viscosity; namely, the more viscous a liquid, the tackier the liquid. Because viscosity of a solvent is to be appreciated by one skilled in the art, viscosity is used accordingly herein.

Tacky fluxes can prevent movement of chips even though vapors are coming out of the flux. Accordingly, as detailed herein, an aspect of the invention includes a flux with properties of effective flip chip joining, tackiness, and efficient water cleaning capability.

As detailed herein, aspects of the invention include soldering techniques and compositions for use therein. In one aspect, a flux composition is provided. The flux composition includes a fluxing agent (an activator) that includes multi-acids that contain two or more carboxylic acid groups. The flux composition also includes a solvent that is a glycerol ethoxylate with a molecular weight of 200-500. By way of example, a glycerol ethoxylate with a molecular weight of 200-500 is Glycereth-7, the molecular weight of which is approximately 400. The glycerol ethoxylate with low molecular weight can prevent flux molecules from producing insoluble organic polymers even in a forced convection furnace with strong N2 gas flow. Further, the flux composition can also include an amine which can play a dual role of enhancing flux-tackiness and flux-residue cleaning capability. In at least one embodiment of the invention, the amine is soluble in water and viscous. Such an amine can include, for example, tetrakis(2-hydroxypropyl)ethylenediamine (Quadrol®), tetrakis(2-hydroxyethyl)ethylenediamine or triethanolamine.

One or more embodiments of the invention include using multi-acids such as oxalic acid, malonic acid, succinic acid, glutaric acid, adipic acid, pimelic acid, suberic acid, diglycolic acid, diethylenetriamine pentaacetic acid, tartaric acid and poly(acrylic acid). In one or more embodiments of the invention, a flux can include a solvent that is employed to control flux application and water cleaning. Yet another component, in one or more embodiments of the invention, can include a solvent to further enhance flux tackiness. Additionally, in one or more embodiments of the invention, a small amount of water (approximately 1% by total weight) can be present since these solvents can absorb moisture from the air.

In a certain type of flip-chip package, a tacky and viscous flux is not required while an effective activator is helpful in making the intended solder connections. Thus, one or more embodiments of the invention include a flux composition that includes one or more activators from the selected diacids (for example, glutaric acid, pimelic acid, tartaric acid, or mixtures thereof) and a solvent, wherein the solvent comprises a polymer with hydroxyl end groups and low molecular weight in the range of 200-500 so that, after solder joining, the flux residue can be cleaned with water.

In another aspect of the invention, a soldering method for joining objects is provided that includes the following steps. A flux composition is applied to at least a portion of one or more of the objects which can include chips and a substrate. The objects are joined at a high temperature. Flux residue formed during the joining process is removed with water so that no failure occurs in the microelectronic package product due to uncleaned flux residue that includes flux itself and flux-tin/solder reaction byproducts. In at least one embodiment of the invention, flux tackiness is high enough not to cause (that is, to prevent) movement of chips during the reflow process (so as to make the chip-substrate interconnections misaligned).

Example embodiments of the invention include composition and use of the following two fluxes. Flux W is prepared with 5-15% by weight glutaric acid as an activator and 85-95% by weight Glycereth-7 as a solvent. Flux X is prepared with 5-15% by weight glutaric acid as an activator, 60-90% by weight Glycereth-7 as a solvent, and 5-25% by weight tetrakis(2-hydroxypropyl)ethylenediamine (Quadrol®) as an amine. These fluxes can be used, for example, in flip chip joining of Pb-free solders. By way of example, Flux X can be spray-applied to a laminate, and a large chip (20 mm×20 mm) with Pb-free solders such as Sn/Cu or Sn/Ag/Cu can be placed on the laminate (55 mm×55 mm). The chip-laminate module can go through a reflow process at 235-250 ° C., and the flux residue at the chip-laminate gap can be removed with deionized water at 40-85° C.

As detailed herein, an example flux composition of an embodiment of the invention includes a solvent being a glycerol ethoxylate with a molecular weight of 200-500. Also, such a flux composition can have a tackiness measure of the composition is a range from 100 gram force to 400 gram force. Additionally, another example flux composition of an embodiment of the invention can have a tackiness measure of the composition is a range from 100 gram force to 800 gram force.

In one or more embodiments of the invention, the activators can include a keto acid that can be selected from levulinic acid, acetyl butyric acid, 2-acetylbenzoic acid, 2-acetyloxybenzoic acid, 2-ketobutyric acid, acetoxyacetic acid, and pyruvic acid or mixtures thereof. Thus, Flux Y can include 5-15 weight % acetyl butyric acid as an activator and 85-95 weight % Glycereth-7 as a low molecular weight solvent.

One or more embodiments of the invention also include a flux composition that includes one or more activators from a selected keto acid (for example, levulinic acid, acetyl butyric acid, 2-acetylbenzoic acid, 2-acetyloxybenzoic acid, 2-ketobutyric acid, acetoxyacetic acid, and pyruvic acid or mixtures thereof), a solvent, wherein the solvent includes a polymer with hydroxyl end groups and low molecular weight in the range of 200-500, and amines. Accordingly, for example, Flux Z includes 5-15 weight % acetyl butyric acid as an activator, 60-90 weight % Glycereth-7 as a low molecular weight solvent and 5-25 weight % tetrakis(2-hydroxypropyl)ethylenediamine (Quadrol®) as an amine.

Also, by way of example, flux W can be prepared by dissolving 8% by weight glutaric acid in a solid state into 92% by weight Glycereth-7 in a liquid state. The mixture can be heated to 50-60 ° C. for one hour and shaken. A homogeneous solution of the flux is then prepared, and the measured tackiness of this flux was in the range of 200-280 gF.

Fluxes such as described herein work in flip-chip joining of Pb-free solders. By way of example, Flux W can be spray-applied or brushed onto a laminate. Then, a large chip (20 millimeters (mm)×20 mm) with Pb-free solders such as, for example, Sn/Cu or Sn/Ag/Cu was placed on the laminate (55 mm×55 mm). The chip-laminate module went through a reflow process at 235-250 degrees Celsius. Flux residue, especially at the chip-laminate gap, was removed with deionized water at 40-80 degrees Celsius. All solder bumps joined to laminate capture pads.

FIG. 1 is a diagram illustrating a substrate, according to an embodiment of the present invention. By way of illustration, FIG. 1 depicts a substrate 12, a pad 14, and a ball grid array (BGA) 16. The substrate can be a laminate containing organic dielectrics, a ceramic substrate made of ceramic dielectrics, a silicon substrate, a glass substrate, a film substrate, a print circuit board (PCB) or a semiconductor device. The pad can be a solder pad or a contact pad. A flux is applied onto the substrate. As described herein, basic requirements of flux can include, by way of example, the following. A flux is preferably tacky enough to hold a chip and a substrate together to overcome vibrations of a reflow-oven belt and emission of vapors. Also, a solder joining should be efficient, producing no non-wets. Further, a flux preferably cleans the chip/substrate/solder joint surfaces with water, with no flux residue left on any of the three surfaces after cleaning.

Figure 2:
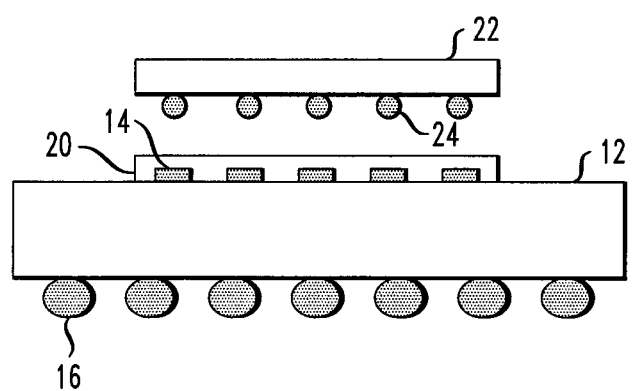
FIG. 2 is a diagram illustrating a flux configuration, according to an embodiment of the present invention.

FIG. 2 is a diagram illustrating a flux configuration, according to an embodiment of the present invention. By way of illustration, FIG. 2 depicts a substrate 12, a pad 14, a ball grid array 16, a flux 20, a semiconductor device (chip) 22 and a solder ball 24. A solder ball 24 can be replaced by a copper pillar capped with solder. When a substrate 12 had a solder pad 14, a solder ball 24 can be replaced by a copper pillar bump or a metal (gold or copper) stud bump. A chip is to be joined onto a substrate to which a flux is applied. A substrate can be, for example, a laminate or a ceramic substrate.

Figure 3A:
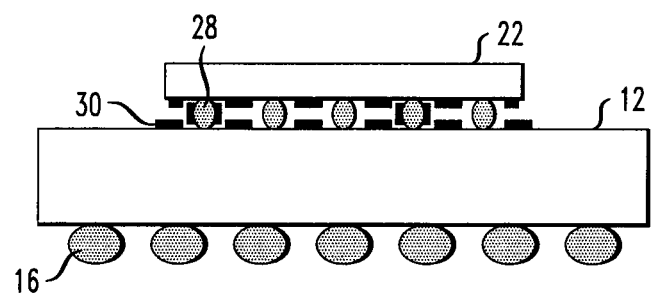
FIGS. 3A and 3B are diagrams illustrating techniques for soldering a semiconductor device to a substrate, according to an embodiment of the present invention.
Figure 3B:
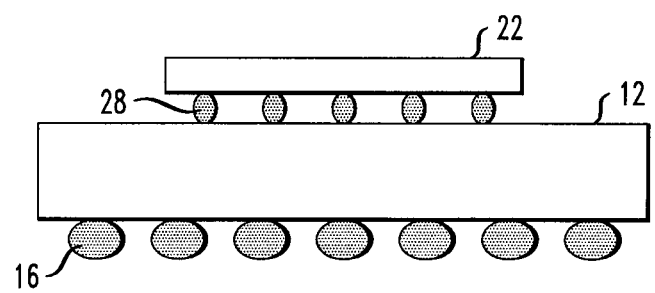

FIGS. 3A and 3B are diagrams illustrating techniques for soldering a chip to a substrate, according to an embodiment of the present invention. By way of illustration, FIG. 3A (and, largely, FIG. 3B as well) depicts a substrate 12, a ball grid array 16, a chip 22, a solder joint (after reflow) 28, and a flux residue 30. Cleaning the flux residue gives FIG. 3B. As such, FIG. 3B depicts a chip-substrate module for which the flux residue is removed typically with water by spraying water at 40-80° C. onto the substrate and into the gap between chip and substrate. Underfill is then applied to the gap to maintain the integrity of the chip-substrate module. The flux residue, if left uncleaned, can cause a failure at the chip-underfill and/or substrate-underfill interface.

Figure 4:
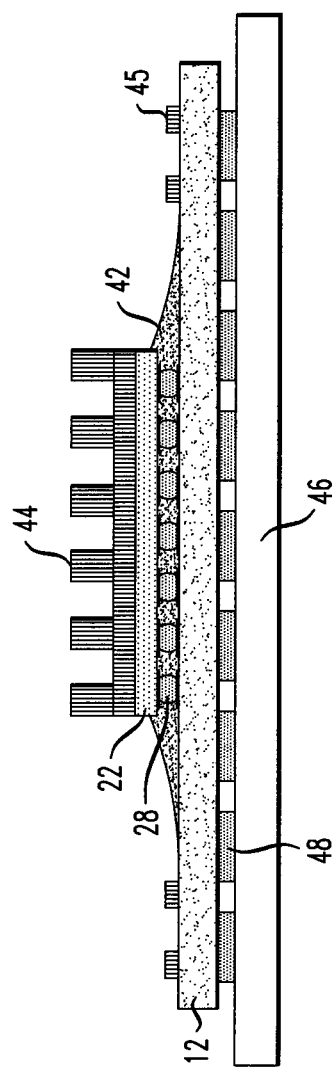
FIG. 4 is a diagram illustrating a flip-chip package configuration, according to an embodiment of the present invention.

FIG. 4 is a diagram illustrating a flip-chip package configuration, according to an embodiment of the present invention. By way of illustration, FIG. 4 depicts a substrate 12, a chip 22, a solder joint 28, an underfill 42, a heat sink (lid) 44, a capacitor 45, a printed wiring board 46, and a BGA joint 48. The underfill not only holds the chip and the substrate together, but also prevents moisture from diffusing to solder joints. The heat sink dissipates heat coming from the chip. BGAs are joined to the large printed wiring board which is also called mother board.

The flux composition of the present invention can be applied, for example, to a chip cage of a substrate, where a chip will be placed, including solder pads 14 (described above in conjunction with the description of FIG. 2). The flux composition may also be applied to contact pads 14 (described above in conjunction with the description of FIG. 2). Additionally, the flux composition can also be applied to a chip 22 including solder balls 24 (described above in conjunction with the description of FIG. 2). The flux composition can also be applied for joining of a capacitor (or resistor) 45 onto a substrate 12 as well as for assembly of a substrate 12 on a printed wiring board 46. Application of the flux composition removes oxide layers out of the solder surfaces and helps achieve chip-substrate solder joining (wetting). The flux composition may be applied to one or more of these structures using conventional application devices, including, but not limited to, a syringe, a brush, a sprayer, a dipper and combinations comprising at least one of the foregoing application devices.

FIG. 2 shows that after the flux composition of the present invention has been applied, where a semiconductor chip 22 is positioned relative to substrate (for example, laminate 12) such that one or more of solder balls 24 contact one or more of the corresponding solder pads 14. As such, a continuous contact is established from solder balls 24 on semiconductor chip 22 to contact pads 14 on substrate 12.

With solder balls 24 and solder pads 14 in contact with each other, the semiconductor chip 22/substrate 12 assembly is heated to melt at least a portion of solder balls 24 and/or solder pads 14. In an example embodiment of the invention, heating is conducted in an oven. During the heating process, the assembly is heated to a temperature of from about 15° C. to about 50° C. above the melting temperature of the solder, to reach a peak reflow temperature. This heating above the melting temperature of the solder helps to ensure that all of the solder reaches a reflow temperature.

For example, a eutectic solder composition, for example, one comprising about 37 percent Pb and about 63 percent Sn, has a melting temperature of about 183° C. and thus the peak reflow temperature would be between about 208° C. to about 233° C. Lead-free solders comprising, for example, about 99.3 percent Sn and about 0.7 percent Cu, have a melting temperature of about 227° C. and those comprising, for example, about 95.5 percent Sn, about 3.8 percent Ag and about 0.7 percent Cu, have a melting temperature of about 217° C. The melting temperature of a certain lead-free solder composition can be approximately 275° C. For these lead-free solders, the peak reflow temperature can be as high as 325° C. The assembly may be kept at the peak reflow temperature for a duration of from about 90 seconds (sec) ±15 sec to about 120 sec±15 sec.

The temperature is then lowered to room temperature. In an example embodiment, the temperature is lowered from the peak reflow temperature at an average rate of about 0.1° C. per sec (as measured from the peak reflow temperature down to 190° C.). As a result of the heating step, solder balls 24 and solder pads 14 undergo melting to make continuous metallurgical and electrical connections between semiconductor chip 22 and substrate 12.

Residues may form on surfaces of the assembly, for example, on the solder-joined regions. These residues can typically include metallic oxides (for example, tin oxides) and organic polymers from flux and organometallic compounds that are formed by the reaction between the solder metals and flux components. Washing may be used to remove these residues. Washing may comprise use of water wash or first the use of an acid wash followed by a water wash.

In one or more embodiments of the invention, the continuous solder connections between semiconductor chip 22 and substrate 12, described above in conjunction with the description of FIG. 3B, may then be encapsulated in, for example, a mixture of an epoxy resin and inorganic fillers, to relieve any strain which may be caused by a difference between the coefficient of thermal expansion (CTE) of substrate 12 and the CTE of semiconductor chip 22. Encapsulating the connections can be accomplished using conventional techniques.

Since Pb may pose health risks, it may be desirable to reduce or eliminate Pb from electrical components. Thus, certain solder compounds may contain, at most, a limited amount of Pb. In one or more embodiments of the invention, a flux composition such as described herein may be used in conjunction with these lead-free solders, especially when the major component of such solder compounds, as is commonly the case, is Sn.

The present flux composition and solder-joining techniques may be employed to mount a pinless chip carrier module, comprising at least one semiconductor chip, for example, an organic module or a ceramic module, to a PCB. Mounting of such a chip carrier module may be accomplished using techniques similar to the mounting techniques described above.

A flux composition and solder-joining techniques of one or more embodiments of the invention may be employed to mount other electronic components, including, but not limited to, resistors and capacitors onto a substrate. Further, while the above techniques have been described in the context of solder-joining electrical components, it is to be understood that the present flux composition and techniques for the use thereof are suitable for any applications that involve flux compositions and the use thereof in solder-joining.

Figure 5A:
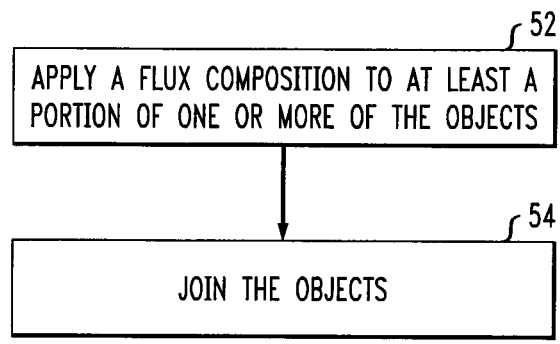
FIGS. 5A and 5B are flow diagrams illustrating techniques for joining objects, according to an embodiment of the present invention.
Figure 5B:
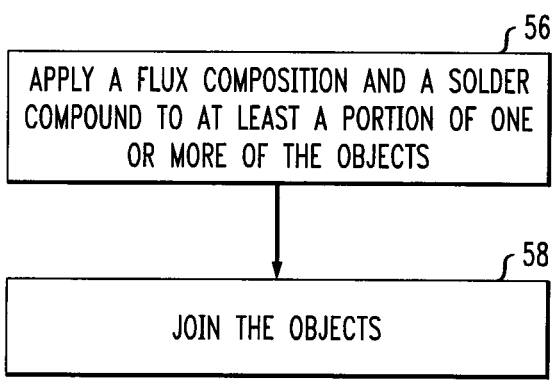

FIGS. 5A and 5B are flow diagrams illustrating techniques for joining objects, according to an embodiment of the present invention. Step 52 includes applying a flux composition to at least a portion of one or more of the objects. Objects can include, for example, a semiconductor device, a chip carrier module, a laminate, a silicon substrate, a glass substrate, a film substrate, a printed circuit board, and/or a ceramic substrate. The flux composition can be applied, for example, to one or more solder regions, to one or more contact pads present on one or more of the objects, etc. Additionally, applying the flux composition can include using an application technique selected from the group including waving, spraying, dipping, brushing, and combinations of the foregoing application techniques. Step 56 includes applying a flux composition and a solder compound to at least a portion of one or more of the objects. Objects can include, for example, a semiconductor device, a chip carrier module, a laminate, a printed circuit board, and/or a ceramic substrate.

The activator can include, for example, a diacid in a liquid state, as well as multi-acids that contain two or more carboxylic acid groups. As detailed herein, the activator can also include, for example, keto acid, which can be selected from levulinic acid, acetyl butyric acid, 2-acetylbenzoic acid, 2-acetyloxybenzoic acid, 2-ketobutyric acid, acetoxyacetic acid, and pyruvic acid or mixtures thereof. Further, in one or more embodiments of the invention, the activator is soluble in both the solvents and water, and it has a boiling point of greater than 250 degrees Celsius. The solvents can each also have a boiling point of greater than 250 degrees Celsius.

Also, as noted, in one or more embodiments of the invention, the flux composition can include one or more amines such as tetrakis(2-hydroxypropyl)ethylenediamine (Quadrol®), tetrakis(2-hydroxyethyl)ethylenediamine, and triethanolamine.

Further, in one or more embodiments of the invention, the composition includes from about five percent by weight to about fifteen percent by weight of the activator, and from about eighty-five percent by weight to about ninety-five percent by weight of the solvent, based on total weight of the composition. One or more embodiments of the invention can also include from about five percent by weight to about twenty-five percent by weight of multi-amines, based on total weight of the composition.

Steps 54 and 58 include joining the objects. Joining the objects can include introducing the objects to heat (for example, heat that includes a range from about 220° C. to about 275° C.). The techniques depicted in FIGS. 5A and 5B can additionally include removing flux residue formed during joining. Removing flux residue can include, for example, using water to remove flux residue.

At least one embodiment of the invention may provide one or more beneficial effects, such as, for example, a flux composition, the property of which includes flip-chip solder joining capability, tackiness, water cleaning capability, and no boiling at reflow. Additionally, at least one embodiment of the invention also provides beneficial effects such as, for example, providing a flux with increased tackiness while the flux maintains other standard flux properties (for example, water solubility).

Further, by way of additional example and not limitation, one or more embodiments of the invention can include the composition and use of fluxes such as the following examples. Flux A includes 5-12 weight % (of total composition weight) glutaric acid as an activator, 15-75 weight % glycerol ethoxylate as a medium viscosity solvent, and 20-80 weight % ethylene glycol-propylene glycol random-copolymer as a high viscosity solvent. Flux B includes 5-12 weight % glutaric acid as an activator, 15-75 weight % glycerol ethoxylate as a medium viscosity solvent, and 20-80 weight % ethylene glycol-propylene glycol-ethylene glycol block copolymer as a high viscosity solvent. Flux C includes 10-20 weight % poly(ethylene glycol)-diacids as an activator and a viscous liquid, 0-90 weight % glycerol ethoxylate, and 0-90 weight % ethylene glycol-propylene glycol random copolymer. Flux D includes 5-12 weight % glutaric acid, 5-15 weight % poly(ethylene glycol) diacids, 0-88 weight % glycerol ethoxylate, and 0-90 weight % ethylene glycol-propylene glycol random copolymer. Flux E includes 6-12 weight % glutaric acid as an activator, 15-70 weight % glycerol ethoxylate as a medium viscosity solvent, 20-75 weight % ethylene glycol-propylene glycol random-copolymer as a high viscosity solvent, and 4-10 weight % multi-amines. Flux F includes 10-20 weight % poly(ethylene glycol)-diacids as an activator and a viscous liquid, 0-86 weight % glycerol ethoxylate, 0-86 weight % ethylene glycol-propylene glycol random copolymer, and 4-10% multi-amines. Multi-amines, as detailed herein, should be soluble in water and can include, for example, tetrakis(2-hydroxypropyl)ethylenediamine (Quadrol®) and tetrakis(2-hydroxyethyl)ethylenediamine.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A flux composition for use in solder-joining electrical components, the composition comprising:
 an activator comprising a mixture of 2-acetyloxybenzoic acid, acetyl butyric acid, levulinic acid, 2-acetylbenzoic acid, 2-ketobutyric acid, acetoxyacetic acid, and pyruvic acid, wherein the activator comprises from about five percent by weight to about fifteen percent by weight of the composition;
 a solvent comprising Glycereth-7, wherein the Glycereth-7 comprises from about sixty percent by weight to about ninety percent by weight of the composition; and
 an amine comprising tetra(hydroxyethyl)ethylenediamine, wherein the tetra(hydroxyethyl)ethylenediamine comprises from about 5 percent by weight to about twenty-five percent by weight of the composition.

2. The flux composition of claim 1, wherein a tackiness measure of the composition is a range from 100 gram force to 400 gram force.

3. A flux composition for use in solder-joining electrical components, the composition comprising:
 an activator comprising a mixture of 2-acetyloxybenzoic acid, acetyl butyric acid, levulinic acid, 2-acetylbenzoic acid, 2-ketobutyric acid, acetoxyacetic acid, and pyruvic acid, wherein the activator comprises from about five percent by weight to about fifteen percent by weight of the composition;

a solvent comprising Glycereth-7, wherein the Glycereth-7 comprises from about eighty-five percent by weight to about ninety-five percent by weight of the composition; and an amine comprising tetra(hydroxyethyl)ethylenediamine, wherein the tetra(hydroxyethyl)ethylenediamine comprises from about 5 percent by weight to about twenty-five percent by weight of the composition.

4. The flux composition of claim 3, wherein the amine is soluble in water and viscous.

5. The flux composition of claim 3, wherein a tackiness measure of the composition is a range from 100 gram force to 800 gram force.

* * * * *